US012676182B2

(12) United States Patent
Lee

(10) Patent No.: US 12,676,182 B2
(45) Date of Patent: Jul. 7, 2026

(54) BIT LINE PRE-CHARGE VOLTAGE GENERATING CIRCUIT IN SEMICONDUCTOR MEMORY DEVICES FOR REDUCING CURRENT CONSUMPTION

(71) Applicant: FIDELIX CO., LTD., Seongnam-si (KR)

(72) Inventor: Jae Jin Lee, Gwangju-si (KR)

(73) Assignee: FIDELIX CO., LTD., Seongnam-si (KR)

( * ) Notice: Subject to any disclaimer, the term of this patent is extended or adjusted under 35 U.S.C. 154(b) by 175 days.

(21) Appl. No.: 18/778,336

(22) Filed: Jul. 19, 2024

(65) Prior Publication Data

US 2025/0140307 A1     May 1, 2025

(30) Foreign Application Priority Data

Oct. 30, 2023    (KR) ......................... 10-2023-0146731

(51) Int. Cl.
*G11C 11/4094*      (2006.01)
*G11C 11/4099*      (2006.01)
(Continued)

(52) U.S. Cl.
CPC ...... *G11C 11/4094* (2013.01); *G11C 11/4099* (2013.01); *H03K 19/01721* (2013.01); *H03K 19/20* (2013.01)

(58) Field of Classification Search
CPC . G11C 11/4094; G11C 11/4099; G11C 5/147; G11C 7/12; H03K 19/01721; H03K 19/20
See application file for complete search history.

(56) References Cited

U.S. PATENT DOCUMENTS 9,508,398 B1 *  11/2016  Shin ........................ G11C 5/147
2008/0094921 A1 *  4/2008  Iida ..................... G11C 11/4094
365/189.09
(Continued)

FOREIGN PATENT DOCUMENTS

KR      10-2003-0057825      7/2003
KR          10-0636914      10/2006
(Continued)

*Primary Examiner* — Jerome Leboeuf
(74) *Attorney, Agent, or Firm* — KILE PARK REED & HOUTTEMAN PLLC

(57)          ABSTRACT

A bit line pre-charge voltage generating circuit in a semiconductor memory device may reduce current consumption. The bit line pre-charge voltage generating circuit includes a reference voltage generating portion that generates a pull-down reference voltage and a pull-up reference voltage; a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage; a driving portion that includes a pull-up driving element and a pull-down driving element; and an activation overlap reduction portion that generates the pull-up control signal and the pull-down control signal The activation overlap reduction portion can minimize the overlap between the turn-on sections of the pull-up driving element and the pull-down driving element of the driving portion.

13 Claims, 6 Drawing Sheets

(51) Int. Cl.
    *H03K 19/017*         (2006.01)
    *H03K 19/20*         (2006.01)

(56)                References Cited

U.S. PATENT DOCUMENTS

2011/0304384 A1*  12/2011  Jeong ..................... G11C 5/147
                                                327/530
2017/0133084 A1*   5/2017  Hwang ............... G11C 11/4091
2020/0082872 A1*   3/2020  Seo ..................... G11C 11/4091

FOREIGN PATENT DOCUMENTS

KR        10-0646978     11/2006
KR        10-1038998      6/2011

* cited by examiner

BIT LINE PRE-CHARGE VOLTAGE GENERATING CIRCUIT IN SEMICONDUCTOR MEMORY DEVICES FOR REDUCING CURRENT CONSUMPTION

CROSS-REFERENCE TO RELATED APPLICATION(S)

This application claims priority to and the benefit of Korean Patent Application No. 10-2023-0146731 under 35 U.S.C. § 119, filed on Oct. 30, 2023 in the Korean Intellectual Property Office (KIPO), the disclosure of which is incorporated herein by reference in its entirety.

BACKGROUND

1. Technical Field

The disclosure relates to a bit line pre-charge voltage generating circuit in a semiconductor memory device, and more particularly, to a bit line pre-charge voltage generating circuit in a semiconductor memory device for reducing current consumption.

2. Discussion of Related Art

In semiconductor memory devices such as DRAM, when accessing data in a memory cell, a bit line pre-charge operation is performed to pre-charge a pair of bit lines. The bit line pre-charge operation is to provide a reference voltage for determining data in a memory cell, and pre-charges the bit line pair to the bit line pre-charge voltage before accessing the data in the memory cell. It is well known that this bit line pre-charge operation is a technology that provides a voltage that serves as a reference for determining data in a memory cell as '1' or '0' in a sense amplifier. The bit line pre-charge voltage is mostly used at a level intermediate between the core voltage, which is the high potential of the data stored in the memory cell, and the ground voltage, which is the low potential. Most semiconductor memory devices have a built-in bit line pre-charge voltage generating circuit that generates the bit line pre-charge voltage.

The bit line pre-charge voltage generating circuit generally includes a PMOS type pull-up driving element and an NMOS type pull-down driving element. The pull-up driving element is formed between the core voltage and the bit line pre-charge voltage, and the pull-down driving element is formed between the ground voltage and the bit line pre-charge voltage.

The pull-up driving element is turned on according to the activation of "L" of the pull-up control signal, and is driven to increase the bit line pre-charge voltage. The pull-down driving element is turned on according to the activation of "H" of the pull-down control signal, and is driven to decrease the bit line pre-charge voltage.

However, in case that the activation of "L" of the pull-up control signal and the activation of "H" of the pull-down control signal overlaps, a current path is formed between the core voltage and the ground voltage through the pull-up driving element and the pull-down driving element.

In this case, current consumption of the bit line pre-charge voltage generating circuit may become large.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is directed to a bit line pre-charge voltage generating circuit for a semiconductor memory device that reduces current consumption with minimizing the overlap between activation of the pull-up control signal and activation of the pull-down control signal.

The technical objectives to be achieved by the disclosure are not limited to those described herein, and other technical objectives that are not mentioned herein would be clearly understood by a person skilled in the art from the description of the disclosure.

According to an aspect of the disclosure, there is provided a bit line pre-charge voltage generating circuit for a semiconductor memory device.

The bit line pre-charge voltage generating circuit for a semiconductor memory device may include a reference voltage generating portion that generates a pull-down reference voltage and a pull-up reference voltage, the level of the pull-down reference voltage being higher than that of the pull-up reference voltage; a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage; a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, and the pull-down driving element being formed between a ground voltage and the bit line pre-charge voltage, and being driven to decrease the level of the bit line pre-charge voltage according to activation of the pull-down control signal; and an activation overlap reduction portion that generates the pull-up control signal and the pull-down control signal by performing a logical operation on the pull-up comparison signal and the pull-down comparison signal. The pull-up control signal may be activated according to activation of the pull-up comparison signal in a deactivated state of the pull-down comparison signal, and may be controlled to be deactivated according to activation of the pull-down comparison signal. The pull-down control signal may be activated according to activation of the pull-down comparison signal in a deactivated state of the pull-up comparison signal, and may be controlled to be deactivated according to activation of the pull-up comparison signal.

The reference voltage generating portion may include a first resistance element formed between the core voltage and the pull-down reference voltage; a second resistance element formed between the pull-down reference voltage and the pull-up reference voltage; and a third resistance element formed between the pull-up reference voltage and the ground voltage.

The comparing portion may include a pull-up comparator that is driven to generate the pull-up comparison signal by comparing the level of the bit line pre-charge voltage with that of the pull-up reference voltage; and a pull-down comparator that is driven to generate the pull-down comparison signal by comparing the level of the bit line pre-charge voltage with that of the pull-down reference voltage.

The pull-up driving element may be a PMOS transistor formed between the core voltage and the bit line pre-charge voltage and gated on the pull-up control signal. The pull-down driving element may be a NMOS transistor formed between the ground voltage and the bit line pre-charge voltage and gated on the pull-down control signal.

The activation overlap reduction portion may include an OR unit for generating the pull-up control signal by performing an OR operation on the pull-up comparison signal and the pull-down comparison signal; and an AND unit for generating the pull-down control signal by performing an AND operation on the pull-up comparison signal and the pull-down comparison signal.

According to another aspect of the disclosure, there is also provided a bit line pre-charge voltage generating circuit for a semiconductor memory device.

The bit line pre-charge voltage generating circuit for a semiconductor memory device may include a reference voltage generating portion that generates a pull-down reference voltage and a pull-up reference voltage, the level of the pull-down reference voltage being higher than that of the pull-up reference voltage; a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage; a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, and the pull-down driving element being formed between a ground voltage and the bit line pre-charge voltage, and being driven to decrease the level of the bit line pre-charge voltage according to activation of the pull-down control signal; and an activation overlap reduction portion that generates the pull-up control signal and the pull-down control signal with receiving the pull-up comparison signal and the pull-down comparison signal. The pull-up control signal may be activated according to activation of the pull-up comparison signal in a deactivated state of the pull-down comparison signal, and may remain in an inactive state despite of the activation of the pull-up comparison signal in case that the pull-down comparison signal is activated. The pull-down control signal may be activated according to activation of the pull-down comparison signal in a deactivated state of the pull-up comparison signal, and may remain in an inactive state despite of the activation of the pull-down comparison signal in case that the pull-up comparison signal is activated.

The reference voltage generating portion may include a first resistance element formed between the core voltage and the pull-down reference voltage; a second resistance element formed between the pull-down reference voltage and the pull-up reference voltage; and a third resistance element formed between the pull-up reference voltage and the ground voltage.

The comparing portion may include a pull-up comparator that is driven to generate the pull-up comparison signal by comparing the level of the bit line pre-charge voltage with that of the pull-up reference voltage; and a pull-down comparator that is driven to generate the pull-down comparison signal by comparing the level of the bit line pre-charge voltage with that of the pull-down reference voltage.

The pull-up driving element may be a PMOS transistor formed between the core voltage and the bit line pre-charge voltage and gated on the pull-up control signal. The pull-down driving element may be a NMOS transistor formed between the ground voltage and the bit line pre-charge voltage and gated on the pull-down control signal.

The activation overlap reduction portion may include a pull-up blocking latch unit for receiving the pull-up comparison signal and the pull-down comparison signal and generating the pull-up control signal, the pull-up control signal being activated according to activation of the pull-up comparison signal in a deactivated state of the pull-down comparison signal, and being latched in an inactive state despite of the activation of the pull-up comparison signal in case that the pull-down comparison signal is in an activate state, and the latch of the pull-up control signal being released in response to deactivation of the pull-down comparison signal; and a pull-down blocking latch unit for receiving the pull-up comparison signal and the pull-down comparison signal and generating the pull-down control signal, the pull-down control signal being activated according to activation of the pull-down comparison signal in a deactivated state of the pull-up comparison signal, and being latched in an inactive state despite of the activation of the pull-down comparison signal in case that the pull-up comparison signal is in an activate state, and the latch of the pull-down control signal being released in response to deactivation of the pull-up comparison signal.

According to another aspect of the disclosure, there is also provided a semiconductor memory device. The semiconductor memory device may include a bit line pre-charge voltage generating circuit that generates a bit line pre-charge voltage.

The bit line pre-charge voltage generating circuit may include a reference voltage generating portion that generates a pull-down reference voltage and a pull-up reference voltage, the level of the pull-down reference voltage being higher than that of the pull-up reference voltage, a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage, a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, the pull-down driving element being formed between a ground voltage and the bit line pre-charge voltage, and being driven to decrease the level of the bit line pre-charge voltage according to activation of the pull-down control signal, and an activation overlap reduction portion that generates the pull-up control signal and the pull-down control signal. The pull-up control signal may be activated according to activation of the pull-up comparison signal in a deactivated state of the pull-down comparison signal. The pull-down control signal may be activated according to activation of the pull-down comparison signal in a deactivated state of the pull-up comparison signal.

The activation overlap reduction portion may generate the pull-up control signal and the pull-down control signal by performing a logical operation on the pull-up comparison signal and the pull-down comparison signal. The pull-up control signal may be controlled to be deactivated according to activation of the pull-down comparison signal. The pull-down control signal may be controlled to be deactivated according to activation of the pull-up comparison signal.

The activation overlap reduction portion may generate the pull-up control signal and the pull-down control signal with receiving the pull-up comparison signal and the pull-down comparison signal. The pull-up control signal may remain in an inactive state despite the activation of the pull-up comparison signal in case that the pull-down comparison signal is activated. The pull-down control signal may remain in an inactive state despite the activation of the pull-down comparison signal in case that the pull-up comparison signal is activated.

In the bit line pre-charge voltage generating circuit of the semiconductor memory device of the disclosure configured as described above, an overlap activation reduction portion is provided to minimize the overlap of activation of the pull-up control signal and the pull-down control signal.

According to the bit line pre-charge voltage generating circuit of the semiconductor memory device of the disclosure, overall current consumption is reduced.

BRIEF DESCRIPTION OF THE DRAWINGS

The above and other aspects, features and advantages of the disclosure will become more apparent to those skilled in the art by describing in detail embodiments thereof with reference to the accompanying drawings, in which.

DETAILED DESCRIPTION OF THE EMBODIMENTS

Embodiments of the disclosure will be described in detail below with reference to the accompanying drawings. While the disclosure is shown and described in connection with embodiments thereof, it will be apparent to those skilled in the art that various modifications can be made without departing from the spirit and scope of the disclosure. Thus, the scope of the disclosure is not limited to these particular following embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises," "comprising," "has," "having," "includes," and/or "including" when used in this specification, specify the presence of stated features, regions, integers, steps, operations, elements, and/or components, but do not preclude the presence or addition of one or more other features, regions, integers, steps, operations, elements, components, and/or groups thereof.

First Embodiment

Figure 1:
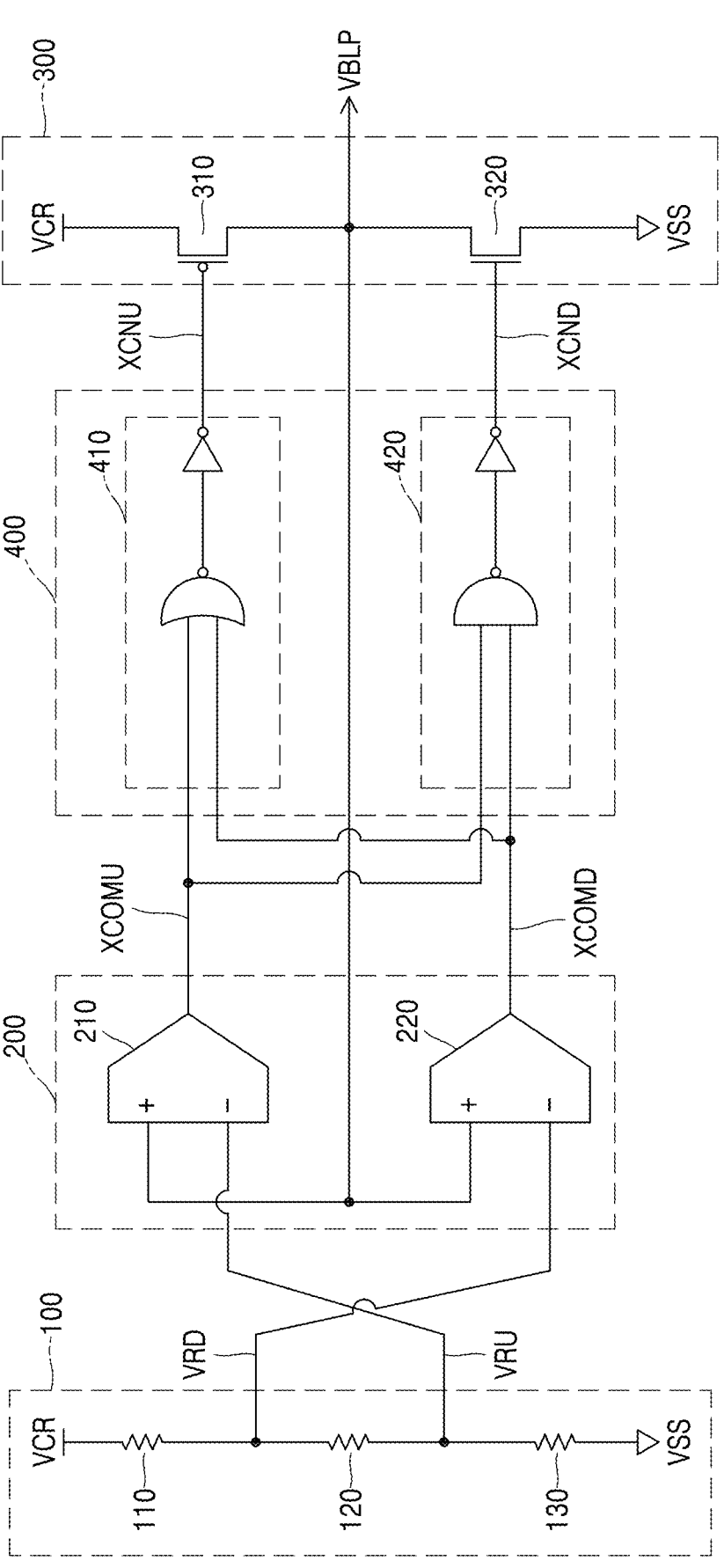
FIG. 1 is a schematic drawing showing a bit line pre-charge voltage generating circuit of a semiconductor memory device according to a first embodiment of the disclosure.

FIG. 1 is a schematic drawing showing a bit line pre-charge voltage generating circuit of a semiconductor memory device according to a first embodiment of the disclosure. The bit line pre-charge voltage generating circuit of FIG. 1 may generate bit line pre-charge voltage VBLP.

Referring to FIG. 1, the bit line pre-charge voltage generating circuit of a semiconductor memory device according to a first embodiment may include a reference voltage generating portion 100, a comparison portion 200, a driving portion 300, and an activation overlap reduction portion 400.

The reference voltage generating portion 100 may generate a pull-down reference voltage VRD and a pull-up reference voltage VRU and may divide the voltage difference between the core voltage VCR and the ground voltage VSS. The level of the core voltage VCR may be higher than that of the ground voltage VSS, and may be a voltage corresponding to a high potential level stored in a cell of a semiconductor memory device. The ground voltage VSS may be a low potential level stored in a cell of a semiconductor memory device.

The reference voltage generating portion 100 may include a first resistance element 110, a second resistance element 120, and a third resistance element 130.

The first resistance element 110 may be formed between the core voltage VCR and the pull-down reference voltage VRD, and the second resistance element 120 may be formed between the pull-down reference voltage VRD and the pull-up reference voltage VRU. The third resistance element 130 may be formed between the pull-up reference voltage VRU and the ground voltage VSS.

According to the reference voltage generating portion 100 configured as described above, the level of the pull-down reference voltage VRD may be higher than that of the pull-up reference voltage VRU.

The comparing portion 200 may generate a pull-up comparison signal XCOMU by comparing the level of the bit line pre-charge voltage VBLP with that of the pull-up reference voltage VRU. The comparing portion 200 may generate a pull-down comparison signal XCOMD by comparing the level of the bit line pre-charge voltage VBLP with that of the pull-down reference voltage VRD.

Figure 2:
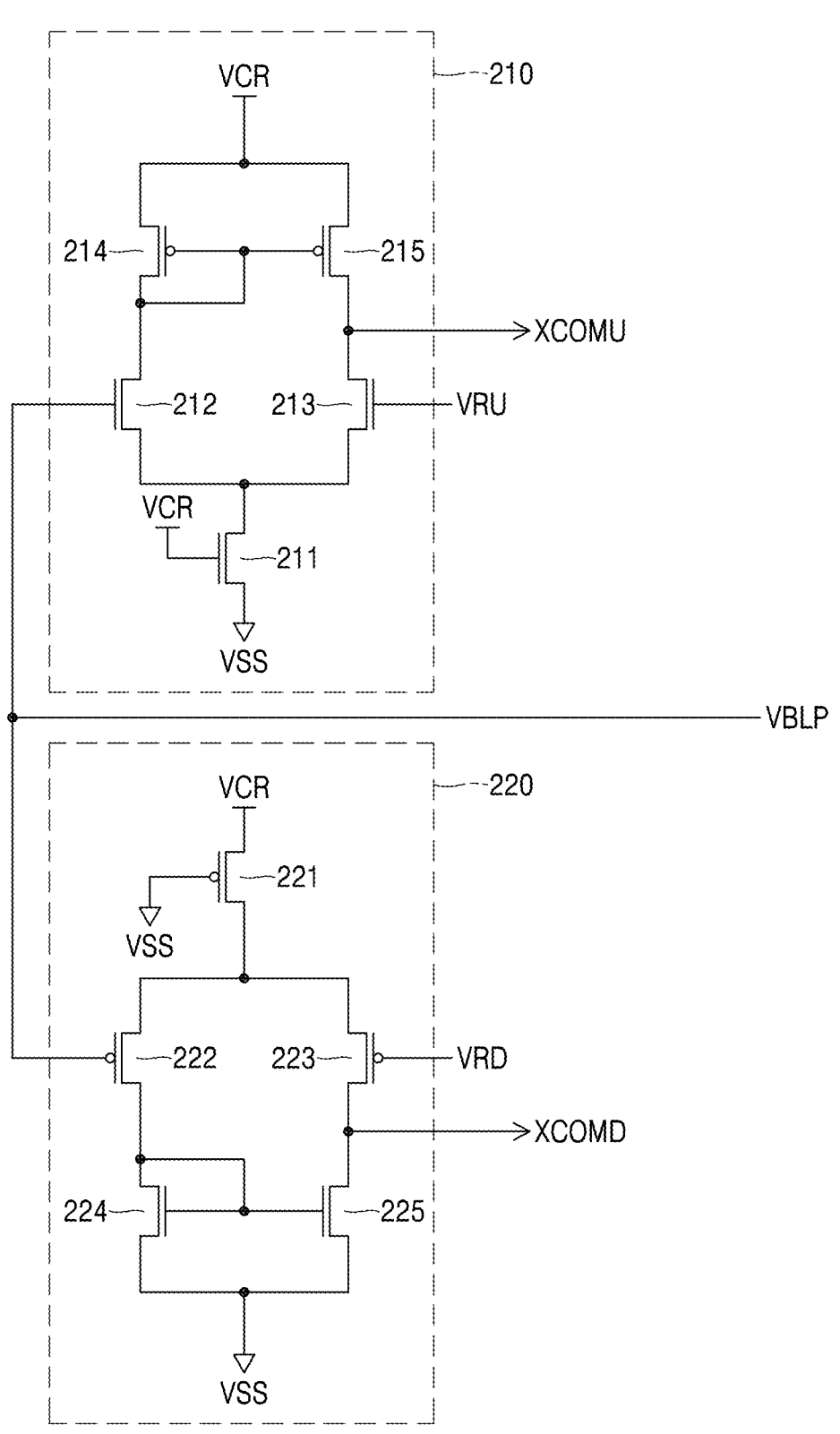
FIG. 2 is a schematic drawing showing the comparison portion of FIG. 1.

FIG. 2 is a schematic drawing showing the comparison portion 200 of FIG. 1. Referring to FIG. 2 together with FIG. 1, the comparing portion 200 may include a pull-up comparator 210 and a pull-down comparator 220.

The pull-up comparator 210 may be driven to generate the pull-up comparison signal XCOMU by comparing the level of the bit line pre-charge voltage VBLP with that of the pull-up reference voltage VRU.

As shown in FIG. 2, the pull-up comparator 210 may include first to fifth transistors 211 to 215.

The first transistor 211 may be an NMOS transistor of which gate node is connected to the core voltage VCR, and of which source node is connected to the ground voltage VSS. The second transistor 212 may be an NMOS transistor of which gate node is connected to the bit line pre-charge voltage VBLP, and of which source node is connected to the drain node of the first transistor 211. The third transistor 213 may be an NMOS transistor of which gate node is connected to the pull-up reference voltage VRU, and of which source node is connected to the drain node of the first transistor 211. The forth transistor 214 may be a PMOS transistor of which source node is connected to the core voltage VCR, and of which gate node and drain node are connected to the drain node of the second transistor 212. The fifth transistor 215 may be a PMOS transistor of which source node is connected to the core voltage VCR, and of which drain node is connected to the drain node of the third transistor 213.

The pull-up comparison signal XCOMU may be output at a node where the drain node of the third transistor 213 and the drain node of the fifth transistor 215 are commonly connected.

According to the pull-up comparator 210 as described above, the pull-up comparison signal XCOMU may be activated to "L" as the level of the bit line pre-charge voltage VBLP becomes lower than that of the pull-up reference voltage VRU. The pull-up comparison signal XCOMU may be deactivated to "H" as the level of the bit line pre-charge voltage VBLP becomes higher than that of the pull-up reference voltage VRU.

The pull-down comparator 220 may be driven to generate the pull-down comparison signal XCOMD by comparing the level of the bit line pre-charge voltage VBLP with that of the pull-down reference voltage VRD.

As shown in FIG. 2, the pull-down comparator 220 may include sixth to tenth transistors 221 to 225.

The sixth transistor 221 may be a PMOS transistor of which gate node is connected to the ground voltage VSS, and of which source node is connected to the core voltage VCR. The seventh transistor 222 may be a PMOS transistor of which gate node is connected to the bit line pre-charge voltage VBLP, and of which source node is connected to the drain node of the sixth transistor 221. The eighth transistor 223 may be a PMOS transistor of which gate node is connected to the pull-down reference voltage VRD, and of which source node is connected to the drain node of the sixth transistor 221. The ninth transistor 224 may be an NMOS transistor of which source node is connected to the ground voltage VSS, and of which gate node and drain node are connected to the drain node of the seventh transistor 222. The tenth transistor 225 may be an NMOS transistor of which source node is connected to the ground voltage VSS, and of which drain node is connected to the drain node of the eighth transistor 223.

The pull-down comparison signal XCOMD may be output at a node where the drain node of the eighth transistor 223 and the drain node of the tenth transistor 225 are commonly connected.

According to the pull-down comparator 220 as described above, the pull-down comparison signal XCOMD may be activated to "H" as the level of the bit line pre-charge voltage VBLP becomes higher than that of the pull-down reference voltage VRD. The pull-down comparison signal XCOMD may be deactivated to "L" as the level of the bit line pre-charge voltage VBLP becomes lower than that of the pull-down reference voltage VRD.

Referring again to FIG. 1, the driving portion 300 may include a pull-up driving element 310 and a pull-down driving element 320.

The pull-up driving element 310 may be formed between the core voltage VCR and the bit line pre-charge voltage VBLP. In an embodiment, the pull-up driving element 310 may be a PMOS transistor of which source node is connected to the core voltage VCR, of which drain node is connected to the bit line pre-charge voltage VBLP, and of which gate node is connected to the pull-up control signal XCNU. The level of the bit line pre-charge voltage VBLP may be increased according to the activation of "L" of the pull-up control signal XCNU.

The pull-down driving element 320 may be formed between the ground voltage VSS and the bit line pre-charge voltage VBLP. In an embodiment, the pull-down driving element 320 may be an NMOS transistor of which source node is connected to the ground voltage VSS, of which drain node is connected to the bit line pre-charge voltage VBLP, and of which gate node is connected to the pull-down control signal XCND. The level of the bit line pre-charge voltage VBLP may be decreased according to the activation of "H" of the pull-down control signal XCND.

However, in case that the pull-up comparison signal XCOMU and the pull-down comparison signal XCOMD are directly provided as the pull-up control signal XCNU and the pull-down control signal (XCND), respectively, a section in which the pull-up driving element 310 and the pull-down driving element 320 are turned on simultaneously may occur.

It is noted that the deactivation response speed of the pull-up comparison signal XCOMU and the pull-down comparison signal XCOMD provided from the comparing portion 200 may be slower than the activation response speed of the pull-up comparison signal XCOMU and the pull-down comparison signal XCOMD according to the bit line pre-charge voltage VBLP.

In other words, in the pull-up comparator 210 and the pull-down comparator 220 having the above configuration, depending on the design and manufacturing process, the deactivation speed of the pull-up comparison signal XCOMU according to the change in the bit line pre-charge voltage VBLP may be significantly slower than the activation speed of the pull-down comparison signal XCOMD. Also, the deactivation speed of the pull-down comparison signal XCOMD according to the change in the bit line pre-charge voltage VBLP may be significantly slower than the activation speed of the pull-up comparison signal XCOMU.

In the activated state of "L" of the pull-up control signal XCNU, the pull-down control signal XCND can be activated to "H". Also, in the activated state of "H" of the pull-down control signal XCND, the pull-up control signal XCNU can be activated to "L".

The turn-on section of the pull-up driving element 310 and the turn-on section of the pull-down driving element 320 may overlap. A current path may be formed between the core voltage VCR and the ground voltage VSS through the pull-up driving element 310 and the pull-down driving element 320.

As a result, the current consumption of the bit line pre-charge voltage generating circuit and the semiconductor memory device including the same may increase significantly.

In order to prevent such current consumption and reduce the overall current consumption, the bit line pre-charge voltage generating circuit of the first embodiment may be provided with an activation overlap reduction portion 400.

The activation overlap reduction portion 400 may generate the pull-up control signal XCNU and the pull-down control signal XCND by performing a logical operation on the pull-up comparison signal XCOMU and the pull-down comparison signal XCOMD.

The activation overlap reduction portion 400 may include an OR unit 410 and an AND unit 420.

The OR unit 410 may generate the pull-up control signal XCNU by performing an OR operation on the pull-up comparison signal XCOMU and the pull-down comparison signal XCOMD.

According to the OR unit 410, the pull-up control signal XCNU may be activated to "L" according to the activation of "L" of the pull-up comparison signal XCOMU in the inactive state of "L" of the pull-down comparison signal XCOMD. The pull-up control signal XCNU may be deactivated to "H" according to the activation of "H" of the pull-down comparison signal XCOMD.

The AND unit 420 may generate the pull-down control signal XCND by performing an AND operation on the pull-up comparison signal XCOMU and the pull-down comparison signal XCOMD.

According to the AND unit 420, the pull-down control signal XCND may be activated to "H" according to the activation of "H" of the pull-down comparison signal XCOMD in the inactive state of "H" of the pull-up comparison signal XCOMU. The pull-down control signal XCND may be deactivated to "L" according to the activation of "L" of the pull-up comparison signal XCOMU.

It is described that the turn-on overlap of the pull-up driving element 310 and the pull-down driving element 320 of the driving portion 300 may be reduced and further blocked by the activation overlap reduction portion 400.

Figure 3:
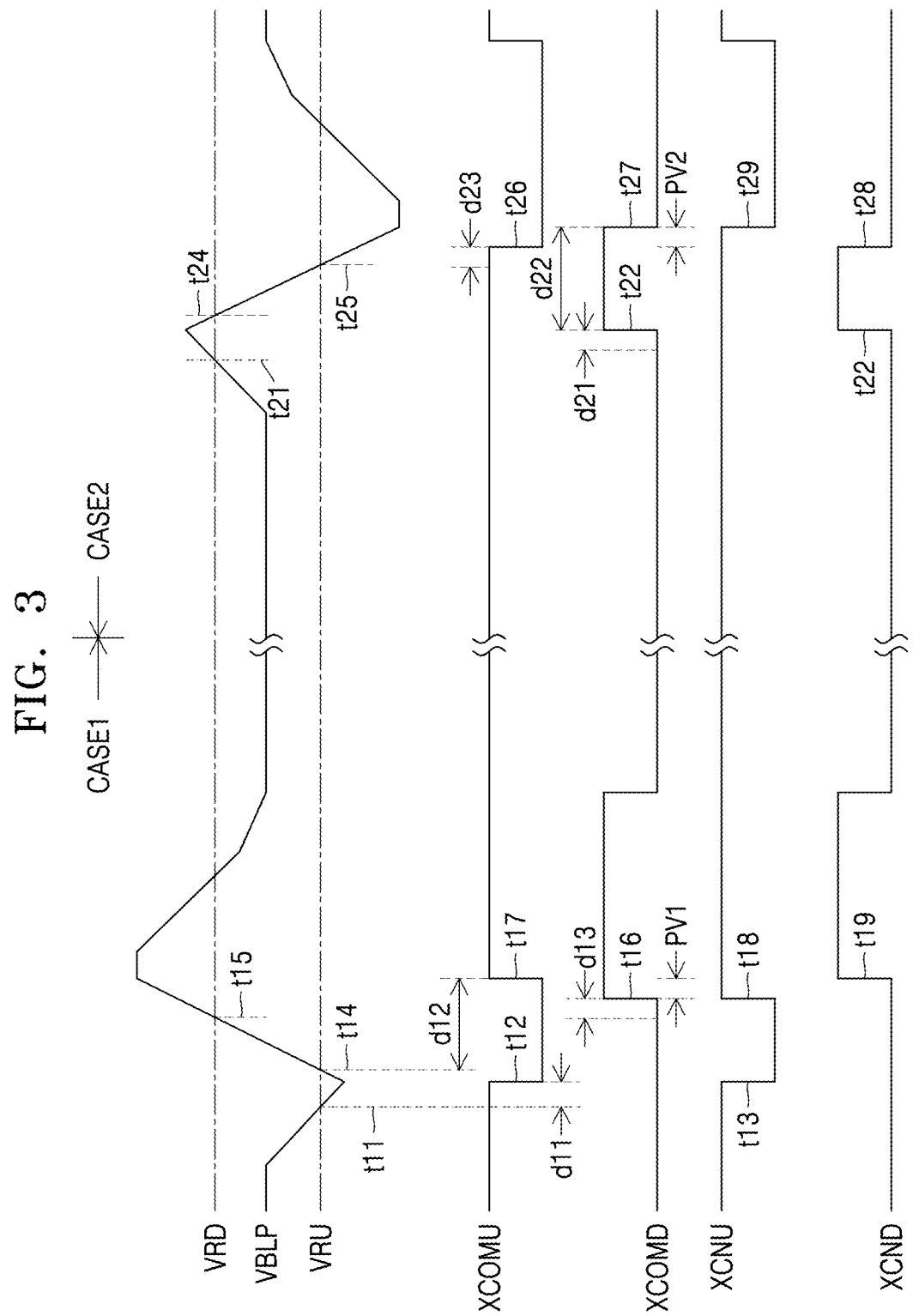
FIG. 3 is a schematic timing diagram showing the operation of main signals of the bit line pre-charge voltage generating circuit of the semiconductor memory device according to the first embodiment of the disclosure.

FIG. 3 is a schematic timing diagram showing the operation of main signals of the bit line pre-charge voltage generating circuit of the semiconductor memory device according to the first embodiment of the disclosure.

In FIG. 3, it may be assumed that, with respect to a change in the level of the bit line pre-charge voltage VBLP, the deactivation speed of the pull-up comparison signal XCOMU and the pull-down comparison signal XCOMD is slower than the activation speed of the pull-up comparison signal XCOMU and the pull-down comparison signal XCOMD. In FIG. 3, the change in the level of each voltage may be depicted as an approximation.

Compared to the delay time by the pull-up comparator 210 and the pull-down comparator 220 of the above comparing portion 200, the delay time by the OR unit 410 and the AND unit 420 of the above activation overlap reduction portion 400 may be significantly shorter. Therefore, in FIG. 3, the delay time by the OR unit 410 and the AND unit 420 of the activation overlap reduction portion 400 may be ignored.

In FIG. 3, CASE1 represents a case where the level of the bit line pre-charge voltage VBLP may be lower than that of the pull-up reference voltage VRU.

First, due to various factors, the level of the bit line pre-charge voltage VBLP may become lower than that of the pull-up reference voltage VRU. Refer to t11. After the activation delay time d11 of the pull-up comparison signal XCOMU has elapsed, the pull-up comparison signal XCOMU may be activated to "L". Refer to t12. The pull-up control signal XCNU may also be activated to "L". Refer to t13.

Then, the level of the bit line pre-charge voltage VBLP may become higher than that of the pull-up reference voltage VRU. Refer to t14. After the deactivation delay time d12 of the pull-up comparison signal XCOMU has elapsed, the pull-up comparison signal XCOMU may be deactivated to "H". Refer to t17.

Here, if the driving capability of the pull-up driving element 310 of the driving portion 300 is very large, the level of the bit line pre-charge voltage VBLP may rise steeply as the pull-up driving element 310 of the driving portion 300 is turned on. The level of the bit line pre-charge voltage VBLP may rise higher than that of the pull-down reference voltage VRD. Refer to t15. After the activation delay time d13 of the pull-down comparison signal XCOMD has elapsed, the pull-down comparison signal XCOMD may be activated to "H". Refer to t16.

If the deactivation speed of the pull-up comparison signal XCOMU is significantly slower than the activation speed of the pull-down comparison signal XCOMD, the deactivation delay time d12 of the pull-up comparison signal XCOMU may become much longer than the activation delay time d13 of the pull-down comparison signal XCOMD.

The deactivation of "H" of the pull-up comparison signal XCOMU may occur later than the activation of "H" of the pull-down comparison signal XCOMD. Refer to t16 and t17. For example, the activation of "L" of the pull-up comparison signal XCOMU and the activation of "H" of the pull-down comparison signal XCOMD may overlap. Refer to PV1.

However, in this embodiment, the deactivation of "H" of the pull-up control signal XCNU may occur according to the activation of "H" of the pull-down comparison signal XCOMD. Refer to t18. The activation of "H" of the pull-down control signal XCND may occur according to the deactivation of "H" of the pull-down comparison signal XCOMD. Refer to t19.

Therefore, in the first embodiment, even if the activation of "L" of the pull-up comparison signal XCOMU and the activation of "H" of the pull-down comparison signal XCOMD overlap, the overlap of the activation of "L" of the pull-up control signal XCNU and the activation of "H" of the pull-down control signal XCND may be blocked. In other words, in this embodiment, the turn-on overlap of the pull-up driving element 310 and the pull-down driving element 320 of the driving portion 300 may be blocked.

In FIG. 3, CASE2 represents a case where the level of the bit line pre-charge voltage VBLP may be higher than that of the pull-down reference voltage VRD.

First, due to various factors, the level of the bit line pre-charge voltage VBLP may become higher than that of the pull-down reference voltage VRD. Refer to t21. After the activation delay time d21 of the pull-down comparison signal XCOMD has elapsed, the pull-down comparison signal XCOMD may be activated to "H". Refer to t22. The pull-down control signal XCND may also be activated to "H". Refer to t23.

Then, the level of the bit line pre-charge voltage VBLP may become lower than that of the pull-down reference voltage VRD. Refer to t24. After the deactivation delay time d22 of the pull-down comparison signal XCOMD has elapsed, the pull-down comparison signal XCOMD may be deactivated to "L". Refer to t27.

If the driving capability of the pull-down driving element 320 of the driving portion 300 is very large, the level of the bit line pre-charge voltage VBLP may fall steeply as the pull-down driving element 320 of the driving portion 300 is turned on. The level of the bit line pre-charge voltage VBLP may fall lower than that of the pull-up reference voltage VRU. Refer to t25. After the activation delay time d23 of the pull-up comparison signal XCOMU has elapsed, the pull-up comparison signal XCOMU may be activated to "L". Refer to t26.

If the deactivation speed of the pull-down comparison signal XCOMD is significantly slower than the activation speed of the pull-up comparison signal XCOMU, the deactivation delay time d22 of the pull-down comparison signal XCOMD may become much longer than the activation delay time d23 of the pull-up comparison signal XCOMU.

The deactivation of "L" of the pull-down comparison signal XCOMD may occur later than the activation of "L" of the pull-up comparison signal XCOMU. Refer to t26 and t27. For example, the activation of "L" of the pull-up comparison signal XCOMU and the activation of "H" of the pull-down comparison signal XCOMD may overlap. Refer to PV2.

However, in this embodiment, the deactivation of "L" of the pull-down control signal XCND may occur according to the activation of "L" of the pull-up comparison signal XCOMU. Refer to t28. The activation of "L" of the pull-down control signal XCND may occur according to the deactivation of "L" of the pull-down comparison signal XCOMD. Refer to t29.

Therefore, in the first embodiment, even if the activation of "L" of the pull-up comparison signal XCOMU and the activation of "H" of the pull-down comparison signal XCOMD overlap, the overlap of the activation of "L" of the pull-up control signal XCNU and the activation of "H" of the pull-down control signal XCND may be blocked. In other words, in this embodiment, the turn-on overlap of the pull-up driving element 310 and the pull-down driving element 320 of the driving portion 300 may be blocked.

In summary, according to the bit line pre-charge voltage generating circuit of the semiconductor memory device of an embodiment, the overlap of the turn-on sections of the pull-up driving element 310 and the pull-down driving element 320 of the driving portion 300 may be minimized, so that the overall current consumption may be reduced.

The bit line pre-charge voltage generating circuit of semiconductor memory device of FIG. 1 in the first embodiment of the disclosure can be modified into various forms.

Second Embodiment

Figure 4:
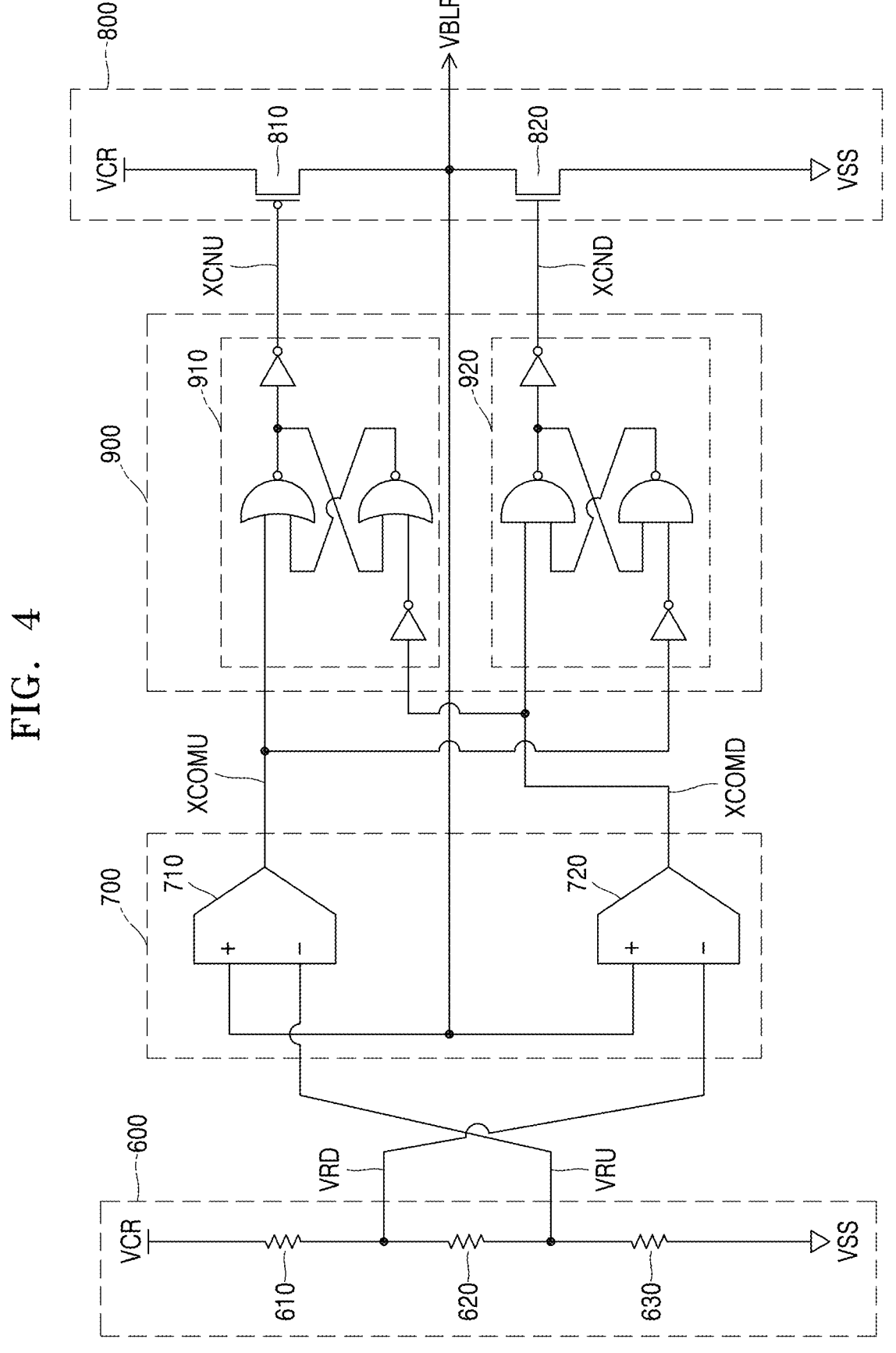
FIG. 4 is a schematic drawing showing a bit line pre-charge voltage generating circuit of a semiconductor memory device according to a second embodiment of the disclosure.

FIG. 4 is a schematic drawing showing a bit line pre-charge voltage generating circuit of a semiconductor memory device according to a second embodiment of the disclosure. The bit line pre-charge voltage generating circuit of FIG. 4 may generate bit line pre-charge voltage VBLP.

Referring to FIG. 4, the bit line pre-charge voltage generating circuit of a semiconductor memory device according to a second embodiment may include a reference voltage generating portion 600, a comparison portion 700, a driving portion 800, and an activation overlap reduction portion 900.

The reference voltage generating portion 600 may generate a pull-down reference voltage VRD and a pull-up reference voltage VRU and may divide the voltage difference between the core voltage VCR and the ground voltage VSS. The level of the core voltage VCR may be higher than that of the ground voltage VSS, and may be a voltage corresponding to a high potential level stored in a cell of a semiconductor memory device. The ground voltage VSS may be a low potential level stored in a cell of a semiconductor memory device.

The reference voltage generating portion 600 may include a first resistance element 610, a second resistance element 620, and a third resistance element 630.

The first resistance element 610 may be formed between the core voltage VCR and the pull-down reference voltage VRD, and the second resistance element 620 may be formed between the pull-down reference voltage VRD and the pull-up reference voltage VRU. The third resistance element 630 may be formed between the pull-up reference voltage VRU and the ground voltage VSS.

According to the reference voltage generating portion 600 configured as described above, the level of the pull-down reference voltage VRD may be higher than that of the pull-up reference voltage VRU.

The comparing portion 700 may generate a pull-up comparison signal XCOMU by comparing the level of the bit line pre-charge voltage VBLP with that of the pull-up reference voltage VRU. The comparing portion 700 may generate a pull-down comparison signal XCOMD by comparing the level of the bit line pre-charge voltage VBLP with that of the pull-down reference voltage VRD.

Figure 5:
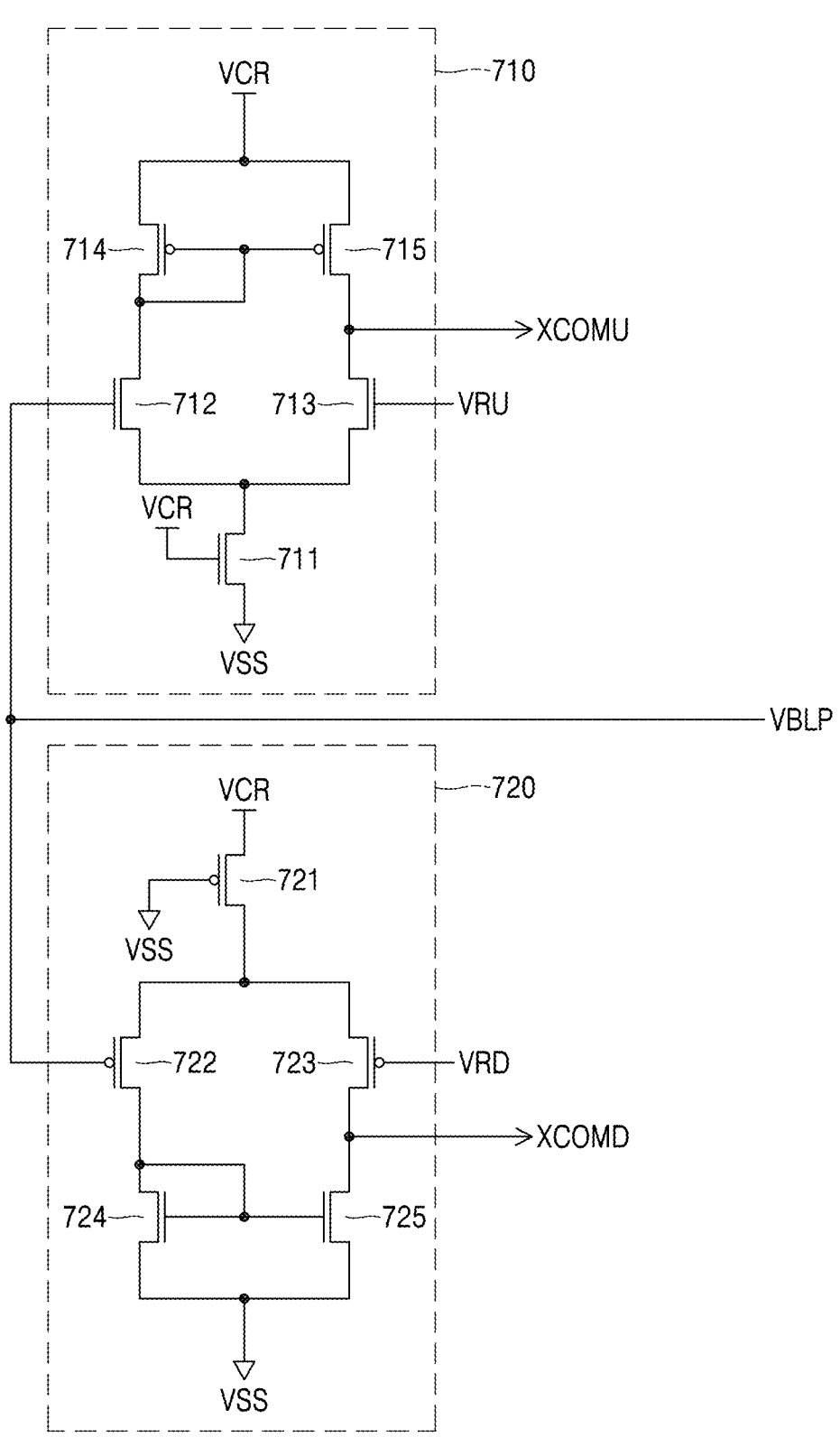
FIG. 5 is a schematic drawing showing the comparison portion of FIG. 4.

FIG. 5 is a schematic drawing showing the comparison portion 700 of FIG. 4. Referring to FIG. 5 together with FIG. 4, the comparing portion 700 may include a pull-up comparator 710 and a pull-down comparator 720.

The pull-up comparator 710 may be driven to generate the pull-up comparison signal XCOMU by comparing the level of the bit line pre-charge voltage VBLP with that of the pull-up reference voltage VRU.

As shown in FIG. 5, the pull-up comparator 710 may include first to fifth transistors 711 to 715.

The first transistor 711 may be an NMOS transistor of which gate node is connected to the core voltage VCR, and of which source node is connected to the ground voltage VSS. The second transistor 712 may be an NMOS transistor of which gate node is connected to the bit line pre-charge voltage VBLP, and of which source node is connected to the drain node of the first transistor 711. The third transistor 713 may be an NMOS transistor of which gate node is connected to the pull-up reference voltage VRU, and of which source node is connected to the drain node of the first transistor 711. The forth transistor 714 may be a PMOS transistor of which source node is connected to the core voltage VCR, and of which gate node and drain node are connected to the drain node of the second transistor 712. The fifth transistor 715 may be a PMOS transistor of which source node is connected to the core voltage VCR, and of which drain node is connected to the drain node of the third transistor 713.

The pull-up comparison signal XCOMU may be output at a node where the drain node of the third transistor 713 and the drain node of the fifth transistor 715 are commonly connected.

According to the pull-up comparator 710 as described above, the pull-up comparison signal XCOMU may be activated to "L" as the level of the bit line pre-charge voltage VBLP becomes lower than that of the pull-up reference voltage VRU. The pull-up comparison signal XCOMU may be deactivated to "H" as the level of the bit line pre-charge voltage VBLP becomes higher than that of the pull-up reference voltage VRU.

The pull-down comparator 720 may be driven to generate the pull-down comparison signal XCOMD by comparing the level of the bit line pre-charge voltage VBLP with that of the pull-down reference voltage VRD.

As shown in FIG. 5, the pull-down comparator 720 may include sixth to tenth transistors 721 to 725.

The sixth transistor 721 may be a PMOS transistor of which gate node is connected to the ground voltage VSS, and of which source node is connected to the core voltage VCR. The seventh transistor 722 may be a PMOS transistor of which gate node is connected to the bit line pre-charge voltage VBLP, and of which source node is connected to the drain node of the sixth transistor 721. The eighth transistor 723 may be a PMOS transistor of which gate node is connected to the pull-down reference voltage VRD, and of which source node is connected to the drain node of the sixth transistor 721. The ninth transistor 724 may be an NMOS transistor of which source node is connected to the ground voltage VSS, and of which gate node and drain node are connected to the drain node of the seventh transistor 722. The tenth transistor 725 may be an NMOS transistor of which source node is connected to the ground voltage VSS, and of which drain node is connected to the drain node of the eighth transistor 723.

The pull-down comparison signal XCOMD may be output at a node where the drain node of the eighth transistor 723 and the drain node of the tenth transistor 725 are commonly connected.

According to the pull-down comparator 720 as described above, the pull-down comparison signal XCOMD may be activated to "H" as the level of the bit line pre-charge voltage VBLP becomes higher than that of the pull-down reference voltage VRD. The pull-down comparison signal XCOMD may be deactivated to "L" as the level of the bit line pre-charge voltage VBLP becomes lower than that of the pull-down reference voltage VRD.

Referring again to FIG. 4, the driving portion 800 may include a pull-up driving element 810 and a pull-down driving element 820.

The pull-up driving element 810 may be formed between the core voltage VCR and the bit line pre-charge voltage VBLP. In an embodiment, the pull-up driving element 810 may be a PMOS transistor of which source node is connected to the core voltage VCR, of which drain node is connected to the bit line pre-charge voltage VBLP, and of which gate node is connected to the pull-up control signal XCNU. The level of the bit line pre-charge voltage VBLP may be increased according to the activation of "L" of the pull-up control signal XCNU.

The pull-down driving element 820 may be formed between the ground voltage VSS and the bit line pre-charge voltage VBLP. In an embodiment, the pull-down driving element 820 may be an NMOS transistor of which source node is connected to the ground voltage VSS, of which drain node is connected to the bit line pre-charge voltage VBLP, and of which gate node is connected to the pull-down control signal XCND. The level of the bit line pre-charge voltage VBLP may be decreased according to the activation of "H" of the pull-down control signal XCND.

However, in case that the pull-up comparison signal XCOMU and the pull-down comparison signal XCOMD are directly provided as the pull-up control signal XCNU and the pull-down control signal (XCND), respectively, a section in which the pull-up driving element 810 and the pull-down driving element 820 are turned on simultaneously may occur.

It is noted that the deactivation response speed of the pull-up comparison signal XCOMU and the pull-down comparison signal XCOMD provided from the comparing portion 700 may be slower than the activation response speed of the pull-up comparison signal XCOMU and the pull-down comparison signal XCOMD according to the bit line pre-charge voltage VBLP.

In other words, in the pull-up comparator 710 and the pull-down comparator 720 having the above configuration, depending on the design and manufacturing process, the deactivation speed of the pull-up comparison signal XCOMU according to the change in the bit line pre-charge voltage VBLP may be significantly slower than the activation speed of the pull-down comparison signal XCOMD. Also, the deactivation speed of the pull-down comparison signal XCOMD according to the change in the bit line pre-charge voltage VBLP may be significantly slower than the activation speed of the pull-up comparison signal XCOMU.

In the activated state of "L" of the pull-up control signal XCNU, the pull-down control signal XCND can be activated to "H". Also, in the activated state of "H" of the pull-down control signal XCND, the pull-up control signal XCNU can be activated to "L".

The turn-on section of the pull-up driving element 810 and the turn-on section of the pull-down driving element 820 may overlap. A current path may be formed between the core voltage VCR and the ground voltage VSS through the pull-up driving element 810 and the pull-down driving element 820.

As a result, the current consumption of the bit line pre-charge voltage generating circuit and the semiconductor memory device including the same may increase significantly.

In order to prevent such current consumption and reduce the overall current consumption, the bit line pre-charge voltage generating circuit of the second embodiment may be provided with an activation overlap reduction portion 900.

The activation overlap reduction portion 900 may generate the pull-up control signal XCNU and the pull-down control signal XCND with receiving the pull-up comparison signal XCOMU and the pull-down comparison signal XCOMD.

The activation overlap reduction portion 900 may include a pull-up blocking latch unit 910 and a pull-down blocking latch unit 920.

The pull-up blocking latch unit 910 may receive the pull-up comparison signal XCOMU and the pull-down comparison signal XCOMD, and may generate the pull-up control signal XCNU.

The pull-up control signal XCNU may be activated to "L" according to activation of "L" of the pull-up comparison signal XCOMU in a deactivated state of "L" of the pull-down comparison signal XCOMD. However, the pull-up control signal XCNU may be latched in an inactive state of "H" despite of the activation of "L" of the pull-up comparison signal XCOMU in case that the pull-down comparison signal XCOMD is in activate state of "H". The latch of the pull-up control signal XCNU may be released in response to deactivation of "L" of the pull-down comparison signal XCOMD.

The pull-down blocking latch unit 920 may receive the pull-up comparison signal XCOMU and the pull-down comparison signal XCOMD, and may generate the pull-down control signal XCND.

The pull-down control signal XCND may be activated to "H" according to activation of "H" of the pull-down comparison signal XCOMD in a deactivated state of "H" of the pull-up comparison signal XCOMU. However, the pull-down control signal XCND may be latched in an inactive state of "L" despite of the activation of "H" of the pull-down comparison signal XCOMD in case that the pull-up comparison signal XCOMU is in activate state of "L". The latch of the pull-down control signal XCND may be released in response to deactivation of "H" of the pull-up comparison signal XCOMU.

It is described that the turn-on overlap of the pull-up driving element 810 and the pull-down driving element 820 of the driving portion 800 may be reduced and further blocked by the activation overlap reduction portion 900.

Figure 6:
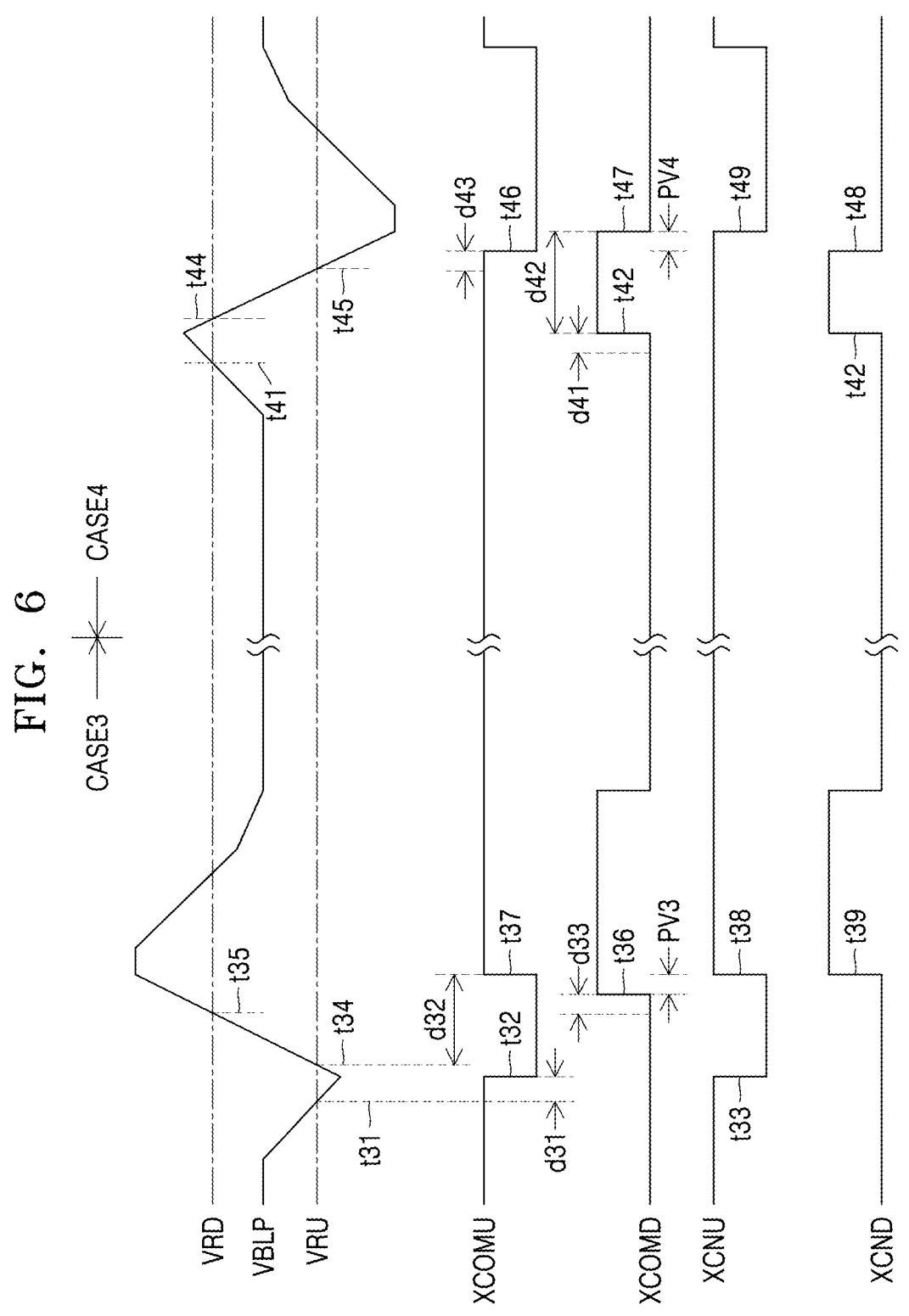
FIG. 6 is a schematic timing diagram showing the operation of main signals of the bit line pre-charge voltage generating circuit of the semiconductor memory device according to the second embodiment of the disclosure.

FIG. 6 is a schematic timing diagram showing the operation of main signals of the bit line pre-charge voltage generating circuit of the semiconductor memory device according to the second embodiment of the disclosure.

In FIG. 6, it may be assumed that, with respect to a change in the level of the bit line pre-charge voltage VBLP, the deactivation speed of the pull-up comparison signal XCOMU and the pull-down comparison signal XCOMD is slower than the activation speed of the pull-up comparison signal XCOMU and the pull-down comparison signal XCOMD. In FIG. 6, the change in the level of each voltage may be depicted as an approximation.

Compared to the delay time by the pull-up comparator 710 and the pull-down comparator 720 of the above comparing portion 700, the delay time by the pull-up blocking latch unit 910 and the pull-down blocking latch unit 920 of the above activation overlap reduction portion 900 may be significantly shorter. Therefore, in FIG. 3, the delay time by the pull-up blocking latch unit 910 and the pull-down blocking latch unit 920 of the activation overlap reduction portion 900 may be ignored.

In FIG. 6, CASE3 represents a case where the level of the bit line pre-charge voltage VBLP may be lower than that of the pull-up reference voltage VRU.

First, due to various factors, the level of the bit line pre-charge voltage VBLP may become lower than that of the pull-up reference voltage VRU. Refer to t31. After the activation delay time d31 of the pull-up comparison signal XCOMU has elapsed, the pull-up comparison signal XCOMU may be activated to "L". Refer to t32. The pull-up control signal XCNU may also be activated to "L". Refer to t33.

Then, the level of the bit line pre-charge voltage VBLP may become higher than that of the pull-up reference voltage VRU. Refer to t34. After the deactivation delay time d32 of the pull-up comparison signal XCOMU has elapsed, the pull-up comparison signal XCOMU may be deactivated to "H". Refer to t37.

Here, if the driving capability of the pull-up driving element 810 of the driving portion 800 is very large, the level of the bit line pre-charge voltage VBLP may rise steeply as the pull-up driving element 810 of the driving portion 800 is turned on. The level of the bit line pre-charge voltage VBLP may rise higher than that of the pull-down reference voltage VRD. Refer to t35. After the activation delay time d33 of the pull-down comparison signal XCOMD has elapsed, the pull-down comparison signal XCOMD may be activated to "H". Refer to t36.

If the deactivation speed of the pull-up comparison signal XCOMU is significantly slower than the activation speed of the pull-down comparison signal XCOMD, the deactivation delay time d32 of the pull-up comparison signal XCOMU may become much longer than the activation delay time d33 of the pull-down comparison signal XCOMD.

The deactivation of "H" of the pull-up comparison signal XCOMU may occur later than the activation of "H" of the pull-down comparison signal XCOMD. Refer to t36 and t37.

For example, the activation of "L" of the pull-up comparison signal XCOMU and the activation of "H" of the pull-down comparison signal XCOMD may overlap. Refer to PV3.

However, in this embodiment, activation of "H" of the pull-down comparison signal XCOMD may be blocked until deactivation of "H" of the pull-up control signal XCNU. For example, the activation of "H" of the pull-down comparison signal XCOMD, which occurs in response to the deactivation of "H" of the pull-up comparison signal XCOMU, may occur almost simultaneously with deactivation of "H" of the pull-up control signal XCNU. Refer to t38 and t39.

Therefore, in the second embodiment, even if the activation of "L" of the pull-up comparison signal XCOMU and the activation of "H" of the pull-down comparison signal XCOMD overlap, the overlap of the activation of "L" of the pull-up control signal XCNU and the activation of "H" of the pull-down control signal XCND may be blocked. In other words, in this embodiment, the turn-on overlap of the pull-up driving element 810 and the pull-down driving element 820 of the driving portion 800 may be blocked.

In FIG. 6, CASE4 represents a case where the level of the bit line pre-charge voltage VBLP may be higher than that of the pull-down reference voltage VRD.

First, due to various factors, the level of the bit line pre-charge voltage VBLP may become higher than that of the pull-down reference voltage VRD. Refer to t41. After the activation delay time d41 of the pull-down comparison signal XCOMD has elapsed, the pull-down comparison signal XCOMD may be activated to "H". Refer to t42. The pull-down control signal XCND may also be activated to "H". Refer to t43.

Then, the level of the bit line pre-charge voltage VBLP may become lower than that of the pull-down reference voltage VRD. Refer to t44. After the deactivation delay time d42 of the pull-down comparison signal XCOMD has elapsed, the pull-down comparison signal XCOMD may be deactivated to "L". Refer to t47.

If the driving capability of the pull-down driving element 820 of the driving portion 800 is very large, the level of the bit line pre-charge voltage VBLP may fall steeply as the pull-down driving element 820 of the driving portion 800 is turned on. The level of the bit line pre-charge voltage VBLP may fall lower than that of the pull-up reference voltage VRU. Refer to t45. After the activation delay time d43 of the pull-up comparison signal XCOMU has elapsed, the pull-up comparison signal XCOMU may be activated to "L". Refer to t46.

If the deactivation speed of the pull-down comparison signal XCOMD is significantly slower than the activation speed of the pull-up comparison signal XCOMU, the deactivation delay time d42 of the pull-down comparison signal XCOMD may become much longer than the activation delay time d43 of the pull-up comparison signal XCOMU.

The deactivation of "L" of the pull-down comparison signal XCOMD may occur later than the activation of "L" of the pull-up comparison signal XCOMU. Refer to t46 and t47. For example, the activation of "L" of the pull-up comparison signal XCOMU and the activation of "H" of the pull-down comparison signal XCOMD may overlap. Refer to PV4.

However, in this embodiment, after deactivation of "L" of the pull-down control signal XCND occurs due to activation of "L" of the pull-up comparison signal XCOMU, deactivation of "H" of the pull-down comparison signal XCOMD and activation of the pull-up control signal (XCNU) to "L" may occur. Refer to t48 and t49.

Therefore, in the second embodiment, even if the activation of "L" of the pull-up comparison signal XCOMU and the activation of "H" of the pull-down comparison signal XCOMD overlap, the overlap of the activation of "L" of the pull-up control signal XCNU and the activation of "H" of the pull-down control signal XCND may be blocked. In other words, in this embodiment, the turn-on overlap of the pull-up driving element 810 and the pull-down driving element 820 of the driving portion 800 may be blocked.

In addition, even in case that abnormal overlap occurs between activation of the pull-up comparison signal XCOMU and activation of the pull-down comparison signal XCOMD, the overlap of the turn-on section of the pull-up driving element 810 and the pull-down driving element 820 of the driving portion 800 may be blocked.

In summary, according to the bit line pre-charge voltage generating circuit of the semiconductor memory device of the an embodiment, the overlap of the turn-on sections of the pull-up driving element 810 and the pull-down driving element 820 of the driving portion 800 may be minimized, so that the overall current consumption may be reduced.

It will be apparent to those skilled in the art that various modifications can be made to the above-described embodiments of the disclosure without departing from the spirit or scope of the disclosure. Thus, it is intended that the disclosure covers all such modifications provided they come within the scope of the appended claims and their equivalents.

What is claimed is:

1. A bit line pre-charge voltage generating circuit in a semiconductor memory device that generates a bit line pre-charge voltage, comprising:

a reference voltage generating portion that generates a pull-down reference voltage and a pull-up reference voltage, the level of the pull-down reference voltage being higher than that of the pull-up reference voltage;

a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage;

a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, and the pull-down driving element being formed between a ground voltage and the bit line pre-charge voltage, and being driven to decrease the level of the bit line pre-charge voltage according to activation of the pull-down control signal; and an activation overlap reduction portion that generates the pull-up control signal and the pull-down control signal by performing a logical operation on the pull-up comparison signal and the pull-down comparison signal, wherein the pull-up control signal is activated according to activation of the pull-up comparison signal in a deactivated state of the pull-down comparison signal, and is controlled to be deactivated according to activation of the pull-down comparison signal, and the pull-down control signal is activated according to activation of the pull-down comparison signal in a deactivated state of the pull-up comparison signal, and is controlled to be deactivated according to activation of the pull-up comparison signal.

2. The bit line pre-charge voltage generating circuit of claim 1, wherein the reference voltage generating portion includes:

a first resistance element formed between the core voltage and the pull-down reference voltage;

a second resistance element formed between the pull-down reference voltage and the pull-up reference voltage; and a third resistance element formed between the pull-up reference voltage and the ground voltage.

3. The bit line pre-charge voltage generating circuit of claim 1, wherein the comparing portion includes:

a pull-up comparator that is driven to generate the pull-up comparison signal by comparing the level of the bit line pre-charge voltage with that of the pull-up reference voltage; and a pull-down comparator that is driven to generate the pull-down comparison signal by comparing the level of the bit line pre-charge voltage with that of the pull-down reference voltage.

4. The bit line pre-charge voltage generating circuit of claim 1, wherein the pull-up driving element is a PMOS transistor formed between the core voltage and the bit line pre-charge voltage and gated on the pull-up control signal, and the pull-down driving element is a NMOS transistor formed between the ground voltage and the bit line pre-charge voltage and gated on the pull-down control signal.

5. The bit line pre-charge voltage generating circuit of claim 1, wherein the activation overlap reduction portion includes:

an OR unit for generating the pull-up control signal by performing an OR operation on the pull-up comparison signal and the pull-down comparison signal; and an AND unit for generating the pull-down control signal by performing an AND operation on the pull-up comparison signal and the pull-down comparison signal.

6. A bit line pre-charge voltage generating circuit in a semiconductor memory device that generates a bit line pre-charge voltage, comprising:

a reference voltage generating portion that generates a pull-down reference voltage and a pull-up reference voltage, the level of the pull-down reference voltage being higher than that of the pull-up reference voltage;

a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage;

a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, and the pull-down driving element being formed between a ground voltage and the bit line pre-charge voltage, and being driven to decrease the level of the bit line pre-charge voltage according to activation of the pull-down control signal; and an activation overlap reduction portion that generates the pull-up control signal and the pull-down control signal with receiving the pull-up comparison signal and the pull-down comparison signal, wherein the pull-up control signal is activated according to activation of the pull-up comparison signal in a deactivated state of the pull-down comparison signal, and remains in an inactive state despite of the activation of the pull-up comparison signal in case that the pull-down comparison signal is activated, and the pull-down control signal is activated according to activation of the pull-down comparison signal in a deactivated state of the pull-up comparison signal, and remains in an inactive state despite of the activation of the pull-down comparison signal in case that the pull-up comparison signal is activated.

7. The bit line pre-charge voltage generating circuit of claim 6, wherein the reference voltage generating portion includes:

a first resistance element formed between the core voltage and the pull-down reference voltage;

a second resistance element formed between the pull-down reference voltage and the pull-up reference voltage; and a third resistance element formed between the pull-up reference voltage and the ground voltage.

8. The bit line pre-charge voltage generating circuit of claim 6, wherein the comparing portion includes:

a pull-up comparator that is driven to generate the pull-up comparison signal by comparing the level of the bit line pre-charge voltage with that of the pull-up reference voltage; and a pull-down comparator that is driven to generate the pull-down comparison signal by comparing the level of the bit line pre-charge voltage with that of the pull-down reference voltage.

9. The bit line pre-charge voltage generating circuit of claim 6, wherein the pull-up driving element is a PMOS transistor formed between the core voltage and the bit line pre-charge voltage and gated on the pull-up control signal, and the pull-down driving element is a NMOS transistor formed between the ground voltage and the bit line pre-charge voltage and gated on the pull-down control signal.

10. The bit line pre-charge voltage generating circuit of claim 6, wherein the activation overlap reduction portion includes:

a pull-up blocking latch unit for receiving the pull-up comparison signal and the pull-down comparison signal and generating the pull-up control signal, the pull-up control signal being activated according to activation of the pull-up comparison signal in a deactivated state of the pull-down comparison signal, and being latched in an inactive state despite of the activation of the pull-up comparison signal in case that the pull-down comparison signal is in an activate state, and the latch of the pull-up control signal being released in response to deactivation of the pull-down comparison signal; and a pull-down blocking latch unit for receiving the pull-up comparison signal and the pull-down comparison signal and generating the pull-down control signal, the pull-down control signal being activated according to activation of the pull-down comparison signal in a deactivated state of the pull-up comparison signal, and being latched in an inactive state despite of the activation of the pull-down comparison signal in case that the pull-up comparison signal is in an activate state, and the latch of the pull-down control signal being released in response to deactivation of the pull-up comparison signal.

11. A semiconductor memory device, comprising:

a bit line pre-charge voltage generating circuit that generates a bit line pre-charge voltage, including:

a reference voltage generating portion that generates a pull-down reference voltage and a pull-up reference voltage, the level of the pull-down reference voltage being higher than that of the pull-up reference voltage;

a comparing portion that generates a pull-up comparison signal by comparing the level of the bit line pre-charge voltage with that of the pull-up reference voltage, and generates a pull-down comparison signal by comparing the level of the bit line pre-charge voltage with that of the pull-down reference voltage, the pull-up comparison signal being activated as the level of the bit line pre-charge voltage is lower than that of the pull-up reference voltage, and the pull-down comparison signal being activated as the level of the bit line pre-charge voltage is higher than that of the pull-up reference voltage;

a driving portion that includes a pull-up driving element and a pull-down driving element, the pull-up driving element being formed between a core voltage and the bit line pre-charge voltage, and being driven to increase the level of the bit line pre-charge voltage according to activation of the pull-up control signal, the pull-down driving element being formed between a ground voltage and the bit line pre-charge voltage, and being driven to decrease the level of the bit line pre-charge voltage according to activation of the pull-down control signal, and an activation overlap reduction portion that generates the pull-up control signal and the pull-down control signal, wherein the pull-up control signal is activated according to activation of the pull-up comparison signal in a deactivated state of the pull-down comparison signal, and the pull-down control signal is activated according to activation of the pull-down comparison signal in a deactivated state of the pull-up comparison signal.

12. The semiconductor memory device of claim 11, wherein the activation overlap reduction portion generates the pull-up control signal and the pull-down control signal by performing a logical operation on the pull-up comparison signal and the pull-down comparison signal, the pull-up control signal is controlled to be deactivated according to activation of the pull-down comparison signal, and the pull-down control signal is controlled to be deactivated according to activation of the pull-up comparison signal.

13. The semiconductor memory device of claim 11, wherein the activation overlap reduction portion generates the pull-up control signal and the pull-down control signal with receiving the pull-up comparison signal and the pull-down comparison signal, the pull-up control signal remains in an inactive state despite of the activation of the pull-up comparison signal in case that the pull-down comparison signal is activated, and the pull-down control signal remains in an inactive state despite the activation of the pull-down comparison signal in case that the pull-up comparison signal is activated.

* * * * *